United States Patent [19]

Hazama et al.

[11] 4,305,897

[45] Dec. 15, 1981

[54] PACKAGING PROCESS FOR SEMICONDUCTORS

[75] Inventors: Keiji Hazama, Shimodate; Yo Maeda, Yuki; Shinichi Ohta, Shimodate, all of Japan

[73] Assignee: Hitachi Chemical Company, Ltd., Tokyo, Japan

[21] Appl. No.: 104,853

[22] Filed: Dec. 18, 1979

[30] Foreign Application Priority Data

Dec. 28, 1978 [JP]  Japan ................................ 53-164752
Jan. 30, 1979 [JP]  Japan .................................... 54-9802
Jan. 30, 1979 [JP]  Japan .................................... 54-9803
Feb. 17, 1979 [JP]  Japan ................................... 54-17566

[51] Int. Cl.$^3$ ...................... B29C 27/04; B29C 27/08; B29C 27/30
[52] U.S. Cl. ......................................... 264/23; 264/25; 264/248; 156/290; 156/308.4; 156/309.6
[58] Field of Search ........................... 264/248, 23, 25; 156/290, 308.2, 308.4, 309.6

[56] References Cited

U.S. PATENT DOCUMENTS

| | | | |
|---|---|---|---|
| 3,219,742 | 11/1965 | Reinert | 264/248 |
| 3,341,649 | 9/1967 | Jamet | 156/308.4 |
| 3,960,636 | 6/1976 | Moffitt | 264/248 |
| 4,051,218 | 9/1977 | Hotton | 264/248 |

FOREIGN PATENT DOCUMENTS 51-98969  8/1976  Japan .
52-77669  6/1977  Japan .

*Primary Examiner*—James B. Lowe
*Attorney, Agent, or Firm*—Craig and Antonelli

[57] ABSTRACT

A process for packaging semiconductors or integrated circuits including semiconductors involves positioning a lead frame on which semiconductors or an integrated circuit are mounted between two thermoplastic resin moldings, at least one of which moldings has a cavity for holding the semiconductors or the integrated circuit and thereafter integrally joining the thermoplastic resin moldings under heat and pressure to the lead frame. An uneven surface is provided on at least a part of the surfaces to be joined of either or both of the two thermoplastic resin moldings. This uneven surface is formed around the cavity in a thermoplastic resin molding having a cavity or on a surface of the thermoplastic resin molding having no cavity which corresponds to the surface to be joined to the other thermoplastic molding having a cavity. The lead frame is interposed or arranged between the two thermoplastic resin moldings so that at least one void is formed between the uneven surface to be joined of at least one of the two thermoplastic resin moldings and the lead frame. The thermoplastic resin moldings are joined by the application of heat and pressure to the lead frame so that at least a part of the at least one void formed prior to joining remains and in this manner harmful flash is prevented from being formed by molten resin produced under the application of heat and pressure.

21 Claims, 24 Drawing Figures

PACKAGING PROCESS FOR SEMICONDUCTORS

BACKGROUND OF THE INVENTION

The present invention relates to a process for packaging hermetically semiconductor devices such as diodes and transistors and semiconductor integrated circuits (semiconductor devices and integrated circuits being hereinafter referred to as "semiconductors"), and more particularly to a process for producing thermoplastic packages such as flat packages and dual-in-line packages by putting a lead frame on which semiconductors are mounted between two thermoplastic resin moldings previously molded, at least one of which has a cavity for holding the semiconductors, and the sealing the molding into a body.

Hitherto, as a process for packaging semiconductors there are known the packaging by hermetically sealing with a metal, ceramics or glass and the packaging with plastics, and in recent years inexpensive plastic packages are the main current because of the increase of the reliability by the progress in technique for protecting chips.

The plastic packages put into practical use at present are classified into two kinds according to processes of the production, i.e. the so-called transfer molding process and casting process. In particular, there have been widely employed the plastic packages produced by a transfer molding process using an epoxy resin which has excellent characteristics such as close adhesion to metals, moisture resistance and electric and mechanical properties.

Figure 1:
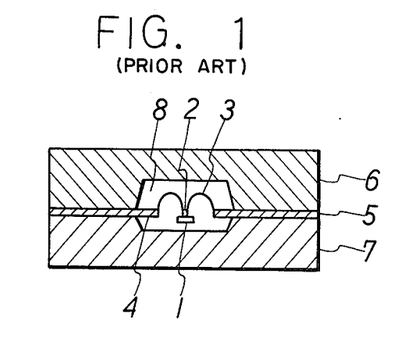
FIGS. 1, 2 and 3 are sectional view of packages to explain conventional proceses for packaging semiconductors.

As shown in FIG. 1 which is sectional view of a package according to a conventional molding process for packaging semiconductors, in such a molding process a semiconductor chip 2 mounted on a tab 1 is interconnected to leads 4 of a lead frame 5 by metal wires 3 such as gold and aluminum, the lead frame 5 is put between an upper mold 6 and a lower mold 7 and a molding resin material is filled in a cavity 8 through a sprue, a runner and a gate of a transfer molding machine (not shown) and is molded.

This molding process has the disadvantage that a gap is formed between the molds and the lead frame due to ununiformity in thickness of the lead frame, accuracy of mold processing, and abrasion and deviation in dimensions of the molds accompanied by the use, and in and around this portion a flash is often formed. Since such a flash on the leads of the lead frame results in poor contact between the leads and a socket and prevents a soldering operation, a deflashing is required. The molding process has a further disadvantage of producing an effect on the reliability of semiconductor functions in some cases, since the chip is in the state of high temperature and high pressure during molding due to direct contact with the resin material.

Figure 2:
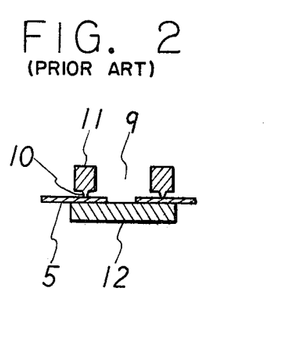

In order to improve such disadvantages of the molding process, there has been proposed a process as disclosed in Japanese Patent Unexamined Publication No. 77669/1977. As shown in FIG. 2 which shows a sectional view of a package, in this process a lead frame 5 with no semiconductors thereon is put between a plastic case 11 having an opening portion 9 and a rib 10 to be welded which has been previously formed from a thermoplastic resin, and a plastic case 12 having a bottom portion. The cases are joined in a body by means of ultrasonic or high-frequency welding and a semiconductor chip (not shown) is then placed therein through the opening portion 9 of the case 11.

However, this process has the following disadvantages. It is necessary to attach the chip within the package through the opening portion 9 of the case 11 and then to interconnect the circuit of the semiconductors to the leads with metal wires and, therefore, the wiring operation is often conducted with difficulty, since the plastic case hinders the operation. Even if the operation is smoothly conducted, there is further required a step of hermetically sealing the opening portion 9 of the case 11 with another cover or a resinous material. Moreover, there is a problem in the reliability of hermetical sealing, since there are two portions to be joined, i.e. the portion between the cases and the leads and the portion between the case and the cover or between the chip and the resinous material.

Figure 3:
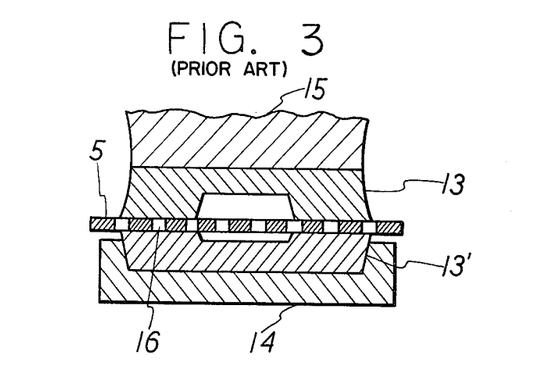

In order to eliminate such disadvantages, the following process for packaging semiconductors has also been proposed. FIG. 3 shows a sectional view of a package obtained according to such a conventional process. Two thermoplastic moldings 13 and 13' previously molded, at least one of which has a cavity for holding semiconductors and between which a lead frame 5 with semiconductors (not shown) is interposed, are placed between a fixture 14 and an ultrasonic vibration horn 15. Ultrasonic vibration is imparted to the thermoplastic moldings 13 and 13' so as to cause the resin made molten by the vibrational friction to flow between the thermoplastic moldings 13 and 13' and into lead gaps 16 of the lead frame 5.

This process also has the following disadvantages. In the contact friction between a flat joining surface of the molding and the lead frame, the contact area is relatively large and a large energy is required to melt the resin. Accordingly, when the ultrasonic vibration time is made constant, the amplitude of the horn must be increased, and on the other hand, when the amplitude is made constant, the vibration for a long period of time is required. These may cause fatal problems in hermetical sealing due to the incorporation of air into the molten resin during vibration, which makes the joint porous, and which leads to deformation and breaking of the delicate leads and bonding wires due to the increase of the amplitude of ultrasonic vibration or the increase of the vibration time.

SUMMARY OF THE INVENTION

In accordance with the present invention, there is provided a process for packaging semiconductors by putting a lead frame on which a semiconductor is mounted, between two thermoplastic moldings, at least one of which has a cavity for holding the a semiconductor, and integrally joining the thermoplastic moldings under heat and pressure, the process being improved in that:

at least one of two thermoplastic moldings has an uneven surface to be joined;

the uneven surface is provided on at least a part of the surface to be joined; that is formed around the cavity in at least one of the thermoplastic molding, and the lead frame is put between the surfaces to be joined of said two thermoplastic moldings and surfaces are joined so that a void formed prior to the joining by the lead frame and the uneven surface remains in part.

Alternatively, in another embodiment the uneven surface is provided on at least a part of the surface to be joined of a thermoplastic molding having no cavity at a position corresponding to the portion of the surface to be joined that is formed around the cavity in the other thermoplastic molding. Also, it is possible that both of the two thermoplastic resin moldings are provided with an uneven surface to be joined to the lead frame.

The process of the present invention can eliminate the disadvantages of conventional processes, and hermetically sealed packages having increased reliability of semiconductor functions can be produced by simplified process steps.

BRIEF DESCRIPTION OF THE DRAWINGS

FIGS. 4 to 10 are views showing several embodiments of the present invention; in which

DETAILED DESCRIPTION

The present invention will be explained in detail with reference to the drawings.

Figure 4:
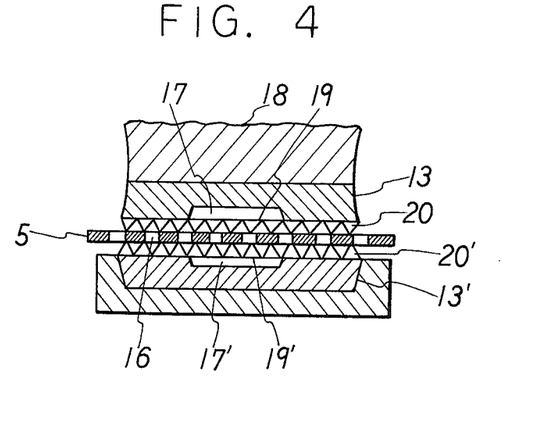
FIG. 4 is a sectional view showing the state at the time of starting to join.
Figure 5A:
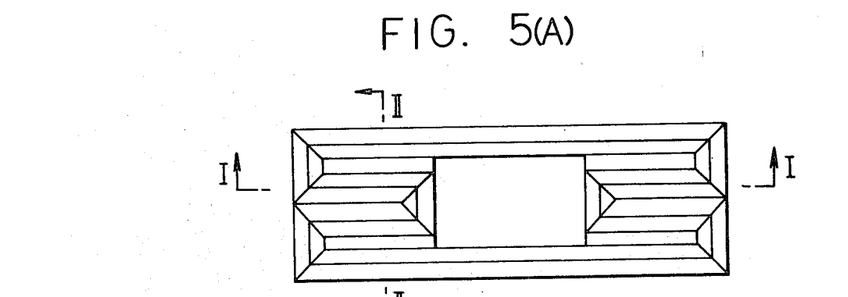
FIG. 5(A) is a plan view of a thermoplastic molding which is usable in the process of the present invention.
Figure 5B:
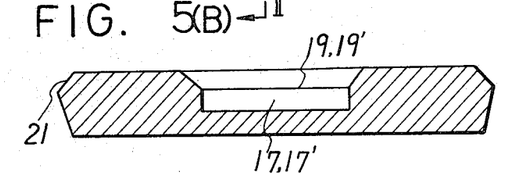
FIG. 5(B) is a sectional view taken on line I—I of FIG. 5(A)
Figure 5C:
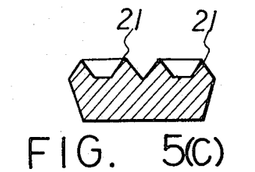
FIG. 5(C) is a sectional view taken on line II—II of FIG. 5(A)

Referring to FIG. 4, at least one of two thermoplastic moldings 13 and 13′ previously molded has a cavity 17 or a cavity 17′ for holding semiconductors (in FIG. 4, both the thermoplastic moldings 13 and 13′ having the cavitites 17 and 17′). Projections 20 or 20′ are provided on either or both of base planes 19 and 19′ located the surfaces of the two thermoplastic moldings 13 and 13′ to be joined (in FIG. 4, both the thermoplastic moldings 13 and 13′ have the projections 20 and 20′). That is to say, a large number of pyramid projections are provided on the surface to be contacted with a lead frame, i.e. the surface to be joined that is formed around the cavity of the thermoplastic molding so that the surface presents unevenness. A lead frame 5 on which semiconductors (not shown) are mounted is put between the thermoplastic moldings 13 and 13′, and the moldings are joined under pressure by a press 18 with heating of the moldings or after heating the lead frame and with heating of at least one of the thermoplastic moldings to the extent that the portion of the thermoplastic moldings to be joined are softened and molten at the time of joining under pressure. The projections 20 and 20′ may be a plurality of projections in pyramid shape as shown in FIG. 4, or may be a single continuous projection 21 as shown in FIGS. 5(A) to 5(C). In the present invention, any shapes are adoptable, and there are preferred those projections that have such a shape that a necessary amount of a resin is molten for a short period of time by as smaller pressure as possible upon joining the moldings under pressure.

The single continuous projection 21 as shown in FIGS. 5(A) to 5(C) is provided on the surface to be joined of at least one thermoplastic molding so that when the molding has a cavity, it will enclose the cavity, or so that when the molding has no cavity, it will enclose a portion corresponding to a cavity of a thermoplastic molding to be paired.

Figure 6A:
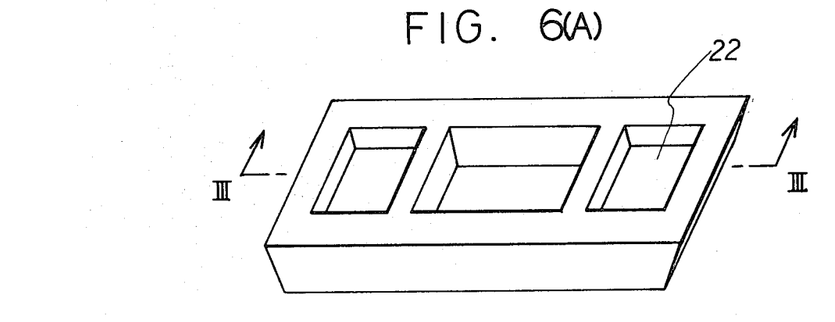
FIG. 6(A) is a perspective view of a thermoplastic molding which is usable in the process of the invention.
Figure 6B:
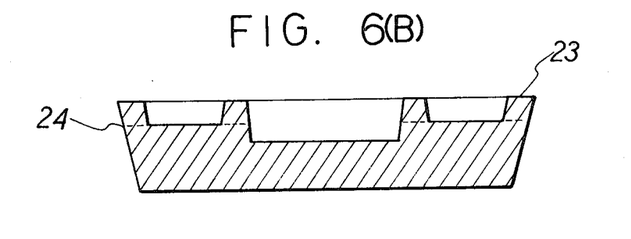
FIG. 6(B) is a sectional view taken on line III—III of FIG. 6(A)

FIGS. 6(A) and 6(B) show another embodiment of a thermoplastic molding, in which FIG. 6(A) is a perspective view and FIG. 6(B) is a sectional view taken on line III—III of FIG. 6(A). A thermoplastic molding having a hollow portion 22 on the surface to be joined that is formed around the cavity, in other words, having a projection 23 so as to enclose the cavity and the hollow portion 22, as shown in FIGS. 6(A) and 6(B), is also employed in the process of the present invention as the thermoplastic molding having the uneven surface on at least a part of the surface to be joined formed around the cavity. The surface 24 corresponds to the base planes 19 and 19′ shown in FIGS. 4 and 5(B).

When a lead frame is interposed between the thermoplastic moldings having an uneven surface to be joined as shown in FIGS. 4 to 6, a void is formed between the lead frame and the surface to be joined, in other words, between the lead frame and the base plane of at least one of the moldings.

Figure 7:
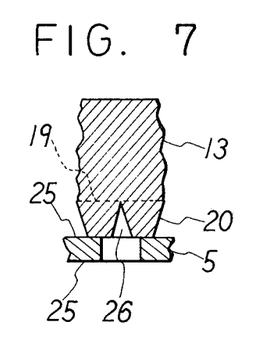
FIG. 7 is an enlarged partial sectional view showing the state in the course of joining.

As shown in FIG. 4, the thermoplastic moldings between which the lead frame is interposed are pressed from the upper and lower sides of the frame. The portions to be joined of the thermoplastic moldings are softened and molten by heat transfer from the lead frame when only the lead frame is heated, or when the portions to be joined are heated. As a result, the molten resin flows into lead gaps 16 of the lead frame 5. With the advance of the melting of the projections provided on the portion to be joined, the molten resin when flows into a void 26 other than the volume occupied by the projections 20, formed between the base planes 19 and 19′ and the surface 25 of the leads of the lead frame, as shown in FIG. 7, and also flows into flash grooves 27 shown in FIG. 8. The moldings and lead frame are finally sealed and joined in a body in the state that the leads are interposed between two thermoplastic moldings.

The important thing upon joining or bonding is that the thermoplastic moldings and the lead frame are joined so that after the completion of the joining, the lead surface 25 does not contact with at least one of the base planes 19 and 19' for the projections positioned on the sides of the joining surfaces of two thermoplastic moldings, and by which the voids 26 are secured between the both sides of the leads and flows onto the base planes. As explained above, in the present invention a part of the void formed prior to the joining still remains even after the completion of the joining. Since the molten resin flows into the voids with the advance of the melting, it would be understood that the voids which remain after the joining are in the state of being partially hollow or being substantially filled with the molten resin.

Into the voids 26 a part of the resin molten by heating flows and integrally joins with the surrounding resin. In order to obtain a satisfactory hermetical welding in the joining under heat and pressure, it is necessary to secure a melting volume larger than a certain volume for raising the temperature of the welding portion over a certain level. It is an indispensible condition to secure the above-mentioned voids in securing the melting volume larger than a certain volume and to provide a heremetical seal.

Figure 8:
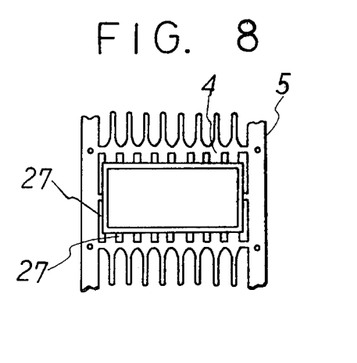
FIG. 8 is a plan view of a package including a lead frame.

In case of not providing the voids 26, it is expected that the minimum volume required to be molten by heating is the gross of the total volume of the lead gaps located within the area corresponding to the surface to be joined of the thermoplastic molding, and the total volume of the flash grooves. According to an instance of 16-pin DIP as shown in FIG. 8, though the melting volume varies depending on the size and the shape of the lead frame and the thermoplastic molding, the gross is about $1.4 \times 10^{-2}$ cm.$^3$, and the melting volume required per one thermoplastic molding is $7 \times 10^{-3}$ cm$^3$. Therefore, in case of densely arranging pyramids, a side of the base of which is 1.6 mm. in length, on the surface to be joined of the thermoplastic molding as the projections, the height of the pyramid calculated is at most 280$\mu$ and becomes as small as the pyramids cannot sufficiently function as the projections to be welded in the case where a hermetical seal is required.

In the present invention, the molten resin which is provided in an amount more than the volume required for obtaining a good joining or bonding state is secured by providing a projection on the side of the surface to be joined of the thermoplastic molding and by joining two moldings so that the surface of the lead frame does not contact with the base plane (in case of FIGS. 4 and 5, the base plane being a plane having the maximum horizontal sectional area of the molding) on which the projection is provided, i.e. so that a part of the molten projection resin flows into the voids between the base plane and the lead surface. In other words, at least a part of either or both of the surface to be joined that is formed around a cavity of a thermoplastic molding and of the surface of a thermoplastic molding having no cavity is made uneven, and the thermoplastic moldings between which a lead frame is interposed are joined so that a void formed prior to the joining by the lead frame and the uneven surface remains in part and, so that a part of the resin molten from the projecting part on the surface to be joined of the thermoplastic molding flows into the void, thus securing the molten resin of more than a volume required in obtaining a good joining state. In many cases, the void is nearly filled with the molten resin, but it is not always required that the void is completely filled.

According to the present invention, a favorable sealing can be attained in any of the following three cases, so long as there is secured sufficient molten resin in a volume of more than that required (by raising the temperature of the portion to be molten and joined over a certain level) to provide the heremetic seal and the temperature in the vicinity of that temperature for more than a certain period of time.

(1) The projection is provided on the surface to be joined of at least one of two thermoplastic moldings. For instance, only the thermoplastic molding having a cavity has an uneven surface to be joined.

(2) Projections capable of engaging with the lead gaps of the lead frame are provided on the surface to be joined of at least one of two thermoplastic moldings.

(3) Two thermoplastic moldings and the lead frame are joined so that the lead frame does not contact with the base plane of at least one of two thermoplastic moldings.

Also, in the similar sense, it is not required that the base plane for the projection is in one plane, so long as the molten resin of the projection flows into the voids. Therefore, the volume of the voids 26 may change depending on the place, and also there is a case where intentional change in shape and arrangement of the projections, namely the voids, may provide a good hermetical seal depending on the shape of the thermoplastic molding. There are frequent cases where it is desirable to provide the projections in the state of being dispersed as much as possible, but the arrangement of the projection is not limited thereto and can be suitably varied in view of the shape, size and appearance of the lead frame and thermoplastic molding, unless the functions of the present invention are impaired.

As the heating means, various heating means are adoptable, such as radiation heating by heat rays, conduction heating by contact with hot plate, heating by hot air and ultrasonic vibration heating. In all heating means, the heating is carried out to the extent that the portion to be joined of the thermoplastic molding is soften and molten. It is also possible to heat, prior to joining under pressure, at least one of the lead frame and the thermoplastic molding to the extent that the portion to be joined of the thermoplastic molding is soften and molten at the time of joining under pressure. In that case, radiation, conduction and convection heating are employed as the heating means.

In order to moderate the heating and pressure conditions and to avoid the deformation and breaking of delicate and brittle lead frame, the thermoplastic molding and lead frame may be preheated in advance of joining them under heat and pressure. Although the preheating condition varies depending on the materials and shapes of the thermoplastic molding and the lead frame, the preheating is generally carried out under temperature and time conditions of below the greatest limits not causing deformation which exerts a bad influence upon the thermoplastic molding. Further, it is necessary to conduct the preheating under temperature and time conditions of below the greatest limits not impairing the functions of semiconductors attached to the lead frame and moreover under temperature and time conditions of below the greatest limits not causing oxidation and annealing. As the heating means for preheating, there are adopted dielectric heating for preheating the thermoplastic molding and induction heating for preheating the lead frame as well as the beforementioned radiation, conduction and convection heating.

The preheating of the thermoplastic molding and the lead frame is advantageous in that the heating and pressure conditions for joining are moderated, the deformation and breaking of delicate and brittle lead frame are avoided, sealing with molten resin is improved, occurrence of flash is reduced, the capacity of the cavity for holding semiconductors is secured easily, and the operation time for welding is shortened.

Figures 9A, 9B:
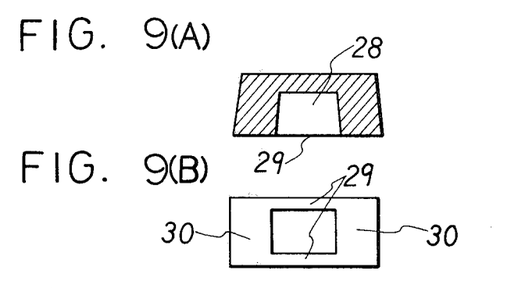
FIG. 9(A) is a sectional view of a conventional thermoplastic molding.
FIG. 9(B) is a plan view of the thermoplastic molding shown in FIG. 9(A)

Ultrasonic welding is desirable, since only the portion necessary for joining can be quickly heated. In a conventional process for the packaging where a lead frame having semiconductors is placed between two thermoplastic moldings having a cavity for holding the semiconductors and having side walls formed around the cavity, the thickness of side walls being different depending on the position, as shown in FIGS. 9(A) and 9(B), and the thermoplastic moldings are then welded by ultrasonic vibration, the surface 29 to be joined of a thin side wall 28 near the center upon which the stress is easy to be concentrated during ultrasonic vibration, is first molten by frictional heat and is molten in excess at the time when a thick side wall 30 is completely molten and joined. Therefore, there sometimes takes place an important defect that the joint of the thin side walls is holed. The present invention can eliminate such a defect of a conventional process.

Figure 10:
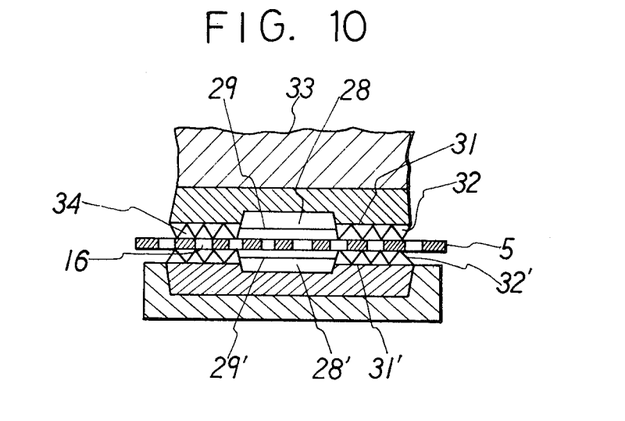
FIG. 10 is a sectional view showing the state at the time of starting to join.

In case of the ultrasonic welding, there is preferably employed in the present invention a thermoplastic molding, as shown in FIG. 10, having a plurality of projections 32 and 32' on base planes 31 and 31' of thick side walls other than the surfaces 29 and 29' to be joined of thin side walls 28 and 28' formed by a cavity, these base planes 31 and 31' being located in substantial parallel with and inside the surfaces 29 and 29' and the projections 32 and 32' projecting above the surfaces 29 and 29'.

Figure 11:
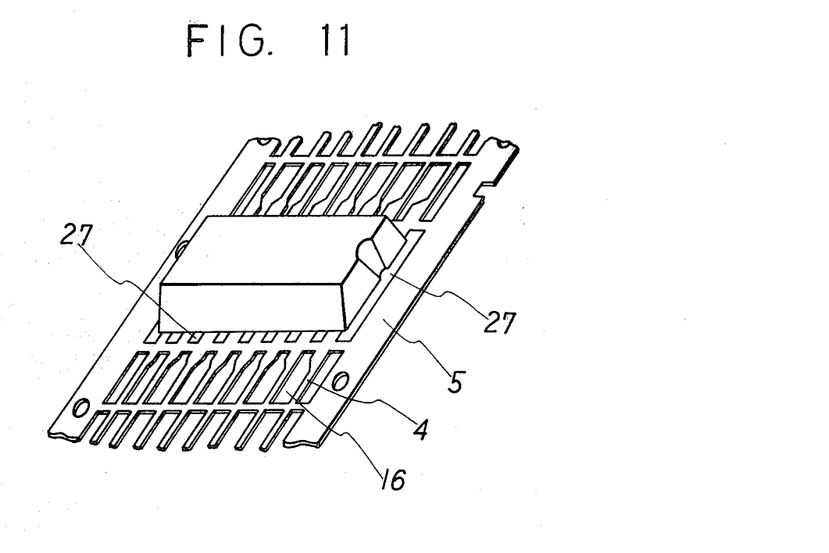
FIG. 11 is a perspective view of a semiconductor package obtained according to the process of the present invention.

The ultrasonic vibration is applied to the thermoplastic moldings through a horn 33. The projections 32 and 32' which contract with a lead frame 5 are first molten by vibration friction. The molten resin flows into lead gaps 16 of the lead frame 5, and as a result of the melting of the projections 32 and 32', the surfaces 29 and 29' to be joined of the thin side walls 28 and 28' then contact with the lead frame 5 and are molten by frictional heat. With the progress of the melting of the projections 32 and 32', the molten resin further flows into voids 34 other than the volume occupied by the projections 32 and 32', formed between the base planes 31 and 31' and the lead surfaces, in the same way as the case of FIG. 7, and also flows into the flash grooves 27 shown in FIG. 8. Finally two thermoplastic moldings between which the leads are interposed are hermetically sealed in a body. FIG. 11 is a perspective view showing the semiconductor package so obtained.

Various thermoplastic resins are employed in the present invention as the materials of the thermoplastic molding, and there are preferably employed the resins having a high heat resistance (heat deformation resistance and heat deterioration resistance), a low moisture permeability, electric and mechanical properties of more than a certain level, and moldability of more than a certain level. Typical examples of the thermoplastic resin are polyether resins such as polyphenylene oxide, polyether sulphone, polysulfone, phenoxy resin and polyacetal, polyester resins such as polyethylene terephthalate, polybutyrene terephthalate and polyarylate, polycarbonate resins, polyamide resins having low water absorbency, and polyphenylene sulfide. These resins may be employed in combination with fillers, including a glass fiber.

The present invention is more specifically described and explained by means of the following Examples.

EXAMPLE 1

By employing a polyarylate resin having a thermal deformation temperature of 175° C. (measured according to ASTM D-648; 18.6 kg./cm.$^2$ load), thermoplastic sheet molding having the same shape and sizes (unit of size: mm.) as those shown in FIGS. 12(A) and 12(B) and a thermoplastic sheet molding having the same shape and sizes as those shown in FIGS. 12(A) and 12(B) except that the thickness was 1.27 mm. were molded, and were preheated together with a 16-pin DIP type lead frame to which a semiconductor integrated circuit chip was attached, in an oven at 200° C. for 2 minutes. A 500 W infrared heater was then brought close to the moldings at a distance of 1 mm. from the projections provided on the surface to be joined of the thermoplastic molding. After heating until the projections were softened and molten so as to have roundness to some extent, the thermoplastic moldings were joined with the positional relationship as shown in FIG. 4 by applying pressure of 4 kg./cm.$^2$ for 5 seconds with a press.

The joined mold so obtained was 2.2 mm. in thickness of the upper half from the lead surface and 1.5 mm. in thickness of the under half from the lead surface, and the whole thickness was 3.95 mm.

Figure 12A:
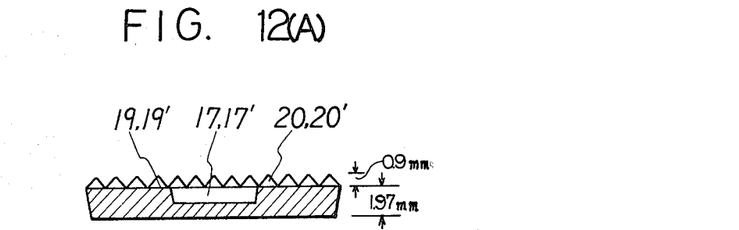
FIGS. 12(A) and 12(B) are section and plan views showing the shape and sizes of a thermoplastic molding employed in Example 1.
Figure 12B:
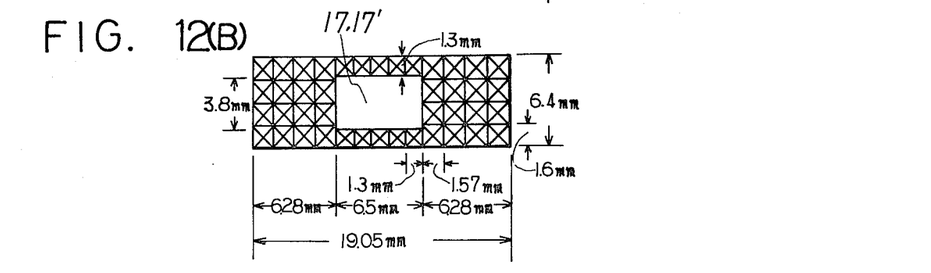

The portions corresponding to about 0.67 mm. in vertical direction of the pyramid projections having a height of 0.9 mm. shown in FIG. 12(A) were molten, and the total volume of the molten resin was $2.43 \times 10^{-3}$ cm.$^3$ A flash which would be an obstacle was scarcely observed on the circumference and the cavity.

In a pressure red water immersion test under 5 kg./cm.$^2$ for 24 hours of the obtained semiconductor package, no permeation of a red matter into the package was observed, and it was confirmed that the package had a good watertight property.

Deformation and breaking of the leads and bonding wires were not also observed.

COMPARATIVE EXAMPLE 1

The procedure of Example 1 was repeated except that the total volume of the projections was made equal to the gross, i.e. $1.4 \times 10^{-2}$ cm.$^3$, of the total volume of the lead gaps located within the area corresponding to the surface to be joined of the thermoplastic molding and the total volume of the flash grooves.

No completely sealed package was obtained.

EXAMPLE 2

By employing a polyphenylene sulfide molding material having a thermal deformation temperature of 260° C. (measured according to ASTM D-648; 18.6 kg./cm.$^2$ load), two thermoplastic moldings having the same shape and sizes as those shown in FIGS. 13(A) and 13(B) were molded. Two thermoplastic moldings and a 16-pin DIP type lead frame having a thickness of 250 $\mu$ to which a semiconductor integrated circuit was attached were heated by blowing air heated at 500° C. at a flow rate of 30 liters/minute for 4 seconds from a hot air heater. After removing the heater, a pressure of 4 kg./cm.² was applied to the thermoplastic moldings by presses to join them.

The joined mold so obtained had a thickness of 3.6 mm. The total volume of the molten resin was about $2.7 \times 10^{-2}$ cm.³

In the pressure red water immersion test under 5 kg./cm.² for 24 hours of the obtained semiconductor package, no permeation of a red matter was observed. Also, no abnormality was observed in a package function test.

COMPARATIVE EXAMPLE 2

Figure 13A:
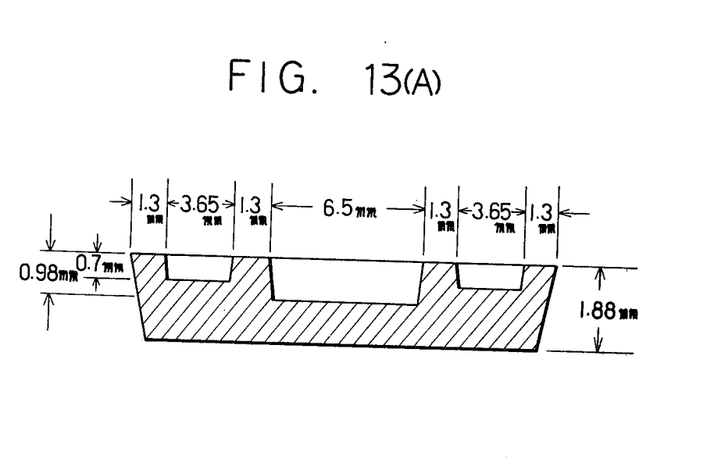
FIGS. 13(A) and 13(B) are section and plan views showing the shape and sizes of a thermoplastic molding employed in Example 2.
Figure 13B:
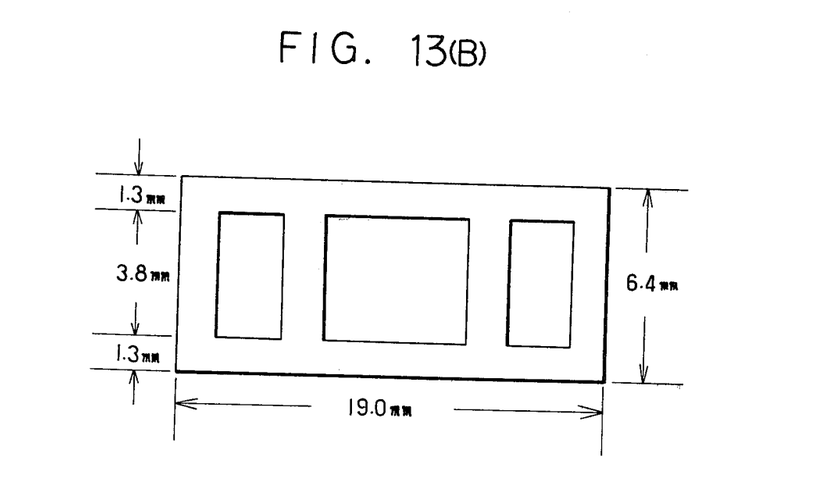

The procedure of Example 2 was repeated by employing two thermoplastic moldings having the same shape and sizes as those shown in FIGS. 13(A) and 13(B) except for having no projection, in other words, having no hollow portions other than the cavity, on the surface to be joined. When the joining was conducted so as to cause no injurious flash, the thickness of the obtained semiconductor package was 3.89 mm. In that case, the total volume of the molten resin was about $1.2 \times 10^{-2}$ In the pressure red water immersion test under 5 kg./cm.² for 24 hours, permeation of a red matter into the package was observed.

EXAMPLE 3

Figure 14A:
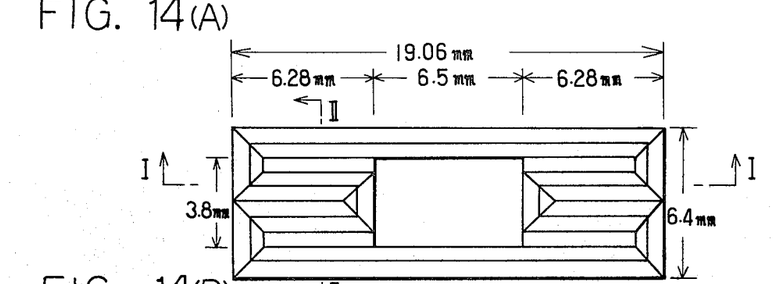
FIG. 14(A) is a plan view showing the shape and sizes of a thermoplastic molding employed in Example 3.

By employing a polyarylate resin having a thermal deformation temperature of 175° C. (measured according to ASTM D-648; 18.6 kg./cm.² load), thermoplastic molding having the same shape and sizes (unit of size: mm.) as those shown in FIGS. 14(A) to 14(C) and a thermoplastic molding having the same shape and sizes as those shown in FIGS. 14(A) to 14(C) except that the thickness [shown by d in FIG. 14(B)] was 1.18 mm. were molded. A 16-pin DIP type lead frame having a thickness of 250 μ was interposed between the obtained two moldings, and after mounting a flexible heat resistant material for preventing flash around them, they were preheated at 200° C. for 2 minutes.

Pressure of 4 kg./cm.² was then applied to the thermoplastic moldings between which the lead frame was interposed, from the side of the thicker thermoplastic molding by a rectangular horn of 20 mm. ×7 mm. in size of the end portion which was attached to an ultrasonic welding apparatus (oscillation frequency: 19.3 kHz, output: 300 W). After adjusting the amplitude of the foremost end of the horn to 35 μ, the ultrasonic oscillation was conducted for 0.8 second.

The integrally joined mold so obtained was 2.2 mm. in thickness of the upper half from the lead surface and 1.5 mm. in thickness of the under half from the lead surface, and the whole thickness was 3.95 mm.

Figure 14B:
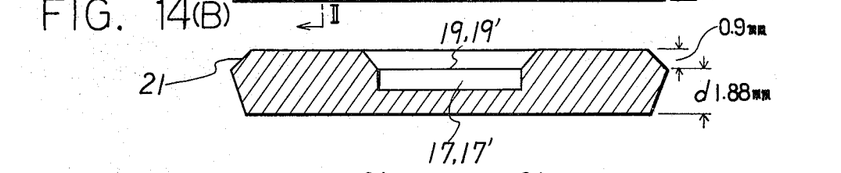
FIGS. 14(B) and 14(C) are a sectional view taken on line I—I of FIG. 14(A) and a sectional view taken on line II—II of FIG. 14(A) respectively, which show the shape and sizes of a thermoplastic molding employed in Example 3.
Figure 14C:
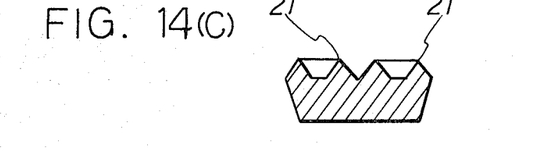

The portions corresponding to about 0.58 mm. in vertical direction of the projection having a height of 0.9 mm. shown in FIG. 14(B) were molten by ultrasonic vibration, and the total volume of the molten resin was $3.16 \times 10^{-2}$ cm.³

A flash which would be an obstacle was scarcely observed on the circumference and the cavity.

In a pressure red water immersion test under 5 kg./cm.² for 24 hours of the obtained semiconductor package, no permeation of a red matter into the package was observed, and it was confirmed that the package had a good seal.

Deformation and breaking of the leads were also not observed.

COMPARATIVE EXAMPLE 3

The procedure of Example 3 was repeated except that the total volume of the projections was made equal to the gross, i.e. $1.4 \times 10^{-2}$ cm.³, of the total volume of the lead gaps located within the area corresponding to the surface to be joined of the sheet mold and the total volume of the flash grooves.

No completely sealed package was obtained.

Ultrasonic oscillation for more than 1.5 seconds was required, when the procedure was conducted to obtain a package which was regarded as being joined in appearance. In that case, the resin containing bubbles filled the cavities 17 and 17' shown in FIG. 14(B), so that the volume of the cavities could not be secured, and also deformation of the lead frame and breaking of the leads were observed. The total volume of the molten resin in that case was $1.4 \times 10^{-2}$ cm.³

EXAMPLE 4

Figure 15A:
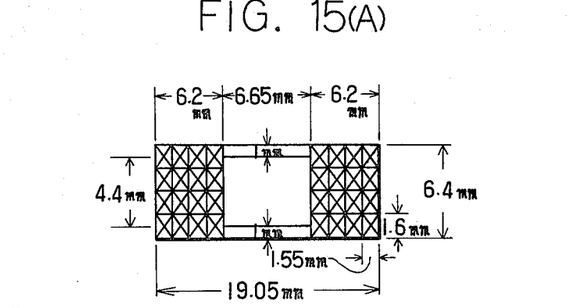
FIGS. 15(A) and 15(B) are plan and section views showing the shape and sizes of a thermoplastic molding employed in Example 4.
Figure 15B:
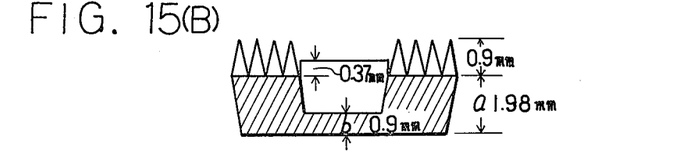

By employing a polyarylate resin having a thermal deformation temperature of 175° C. (measured according to ASTM D-648; 18.6 kg./cm.² load), a thermoplastic molding having the shape and sizes as those shown in FIGS. 15(A) and 15(B) and a thermoplastic molding having the shape and sizes as those shown in FIGS. 15(A) and 15(B) excepting a =1.28 mm. and b =1.1 mm. were molded.

A 16-pin DIP type lead frame having a thickness of 250 μ to which a semiconductor integrated circuit was attached was interposed between the thermoplastic moldings, and after mounting a flexible heat resistant material for preventing flash around them, they were preheated at 200° C. for 2 minutes.

Pressure of 4 kg./cm.² was then applied to the thermoplastic moldings from the side of the thicker thermoplastic molding by a rectangular horn of 20 mm. ×7 mm. in size of the end portion which was attached to an ultrasonic welding apparatus (oscillation frequency: 19.3 kHz, output: 300 W). After adjusting the amplitude of the foremost end of the horn to 35 μ, the ultrasonic oscillation was conducted for 0.8 second.

The integrally joined mold so obtained was 2.2 mm. in thickness of the upper half from the lead surface and 1.5 mm. in thickness of the under half from the lead surface, and the whole thickness was 3.95 mm.

A flash which would be an obstacle was scarcely observed on the circumference and the cavity.

In a pressure red water immersion test under 5 kg./cm.² for 24 hours of the obtained semiconductor package, no permeation of a red matter into the package was observed, and it was confirmed that the package had a good seal.

COMPARATIVE EXAMPLE 4

A semiconductor package was prepared in the same manner as in Example 4 except that thermoplastic moldings had no projections and had the surface to be joined of the thick side walls located on the same plane as the surface to be joined of the thin side walls.

Ultrasonic oscillation for more than 2 seconds was required in obtaining a package which was regarded as being joined in appearance. In that case, cavities for holding a semiconductor integrated circuit were filled with the resin containing bubbles, and the volume of the cavities could not be secured. Also, deformation of the lead frame and breaking of the leads were observed.

According to the present invention, the following effects can be produced.

(1) By joining two thermoplastic moldings between which a lead frame is interposed so that a base plane for a projection which is provided on the side of the surface to be joined of at least one thermoplastic molding does not contact with the lead frame. In other words, by making uneven at least a part of either or both of the surface to be joined of the side walls formed around a cavity of a thermoplastic molding having a cavity and the surface of a thermoplastic resin sheet mold having no cavity, of the portion corresponding to the surface to be joined of the side walls formed around a cavity of a thermoplastic molding having a cavity to be paired therewith, and joining the two thermoplastic moldings at least one of which has a cavity so that a void formed prior to the joining of the lead frame and the uneven surface provided on the surface to be joined remains in part regardless of being filled with the molten resin. Thus it becomes possible to melt a resin of more than a volume required in raising the temperature of the portion to be joined over a certain level, and as a result, an improved seal can be obtained.

(2) It is possible to automatize the assembly of a semiconductor package.

(3) Formation of flash upon molding is scarcely observed, since the viscosity of the molten resin upon molding can be maintained high as compared with a conventional process for sealing a mold using thermosetting resins. Therefore, process steps can be reduced. Also, since at least one of two thermoplastic moldings to be joined has a cavity for holding semiconductors, there is no damage of wires for connecting semiconductors to the leads, and furthermore, the reliability of semiconductor functions can be increased by reason that, for instance, it is hard for an ionic material to contact with the semiconductors because high temperature and high pressure are not applied to the semiconductors.

(4) Since a hermetically sealed package of semiconductors can be molded by one joining operation, process steps can be simplified as compared with a conventional process for packaging semiconductors where a mold having an opening and a mold having a bottom are joined in the state that a lead frame to which semiconductors are not attached is interposed between the molds, and semiconductors are then attached to the lead frame and the opening is sealed.

What we claim is:

1. In a process for packaging semiconductors wherein a lead frame on which semiconductors are mounted is positioned between two thermoplastic resin moldings, at least one of which has a cavity for holding the semiconductors, and the lead frame is integrally joined to the thermoplastic moldings under heat and pressure, the improvement which comprises:
providing at least one of said two thermoplastic resin moldings with an uneven surface to be joined to the lead frame,
placing the lead frame between the surfaces to be joined of said two thermoplastic moldings to form a void between the uneven surface to be joined of at least one of the moldings and the lead frame and
joining the moldings to the lead frame by applying heat and pressure so that sufficient molten resin is formed to provide a hermetic seal between the lead frame and the two thermoplastic resin moldings and so that at least a part of the void formed prior to the joining of said lead frame and the two thermoplastic resin moldings remains whereby harmful flash is prevented from being formed by the molten resin.

2. The process of claim 1, wherein the void remaining after joining is substantially filled with the molten resin.

3. The process of claim 1, wherein said uneven surface is in the shape of a plurality of pyramid projections.

4. The process of claim 1, wherein said uneven surface is in the shape of a single continuous projection provided on at least one of the two thermoplastic resin moldings to enclose the cavity.

5. The process of claim 1, wherein said uneven surface is a projection formed by a hollow portion provided on at least a part of the surface to be joined on one of the two thermoplastic resin moldings.

6. The process of claim 1, wherein at least one of the thermoplastic resin moldings and the lead frame is heated prior to joining under pressure to the extent that the portion to be joined of the thermoplastic resin moldings is softened and molten at the time of joining under pressure.

7. The process of claim 1, wherein prior to joining under heat and pressure at least one of the thermoplastic resin moldings and the lead frame is preheated under temperature and time conditions that the functions of the semiconductors mounted on the lead frame are not lowered when the lead frame is preheated or the thermoplastic resin molding is not softened and molten when the molding is preheated.

8. The process of claim 1, wherein the heating is applied by means providing ultrasonic vibration heating, radiation heating, conduction heating or convection heating.

9. The process of claim 1, wherein a plurality of voids is formed between at least one of the moldings and the lead frame.

10. The process of claim 1, wherein a plurality of voids is formed between each of the moldings and the lead frame.

11. The process of claim 1, wherein the lead frame is provided with a plurality of lead gaps and the lead frame is arranged between said two moldings so that a plurality of the lead gaps is arranged between the two moldings, whereby molten resin flows into said lead gaps upon application of heat and pressure.

12. The process of claim 1, wherein said uneven surface is provided on at least a part of a surface to be joined that is formed around a cavity in one of the thermoplastic resin moldings for holding semiconductors.

13. The process of claim 1, wherein said uneven surface is provided on at least a part of a surface to be joined of one of the two thermoplastic resin moldings having no cavity for holding the semiconductors at a position corresponding to the surface to be joined that is formed around a cavity formed in the other of the two thermoplastic resin moldings for holding the semiconductors.

14. The process of claim 1, wherein one of the two thermoplastic resin moldings is provided with a cavity for holding the semiconductors and an uneven surface to be joined is provided on two portions of a surface formed around said cavity on said one of the two thermoplastic resin moldings.

15. The process of claim 1, wherein each of the two thermoplastic moldings is provided with a cavity for holding semiconductors, the cavity in one thermoplastic resin molding mating with the cavity formed in the other of the two thermoplastic resin moldings and an uneven surface to be joined is provided on two portions of the surface formed around a cavity in at least one of the two thermoplastic moldings.

16. The process of claim 1, wherein one of the two thermoplastic resin moldings is provided with a cavity for holding semiconductors and the other of the two thermoplastic resin moldings has no cavity for holding semiconductors and an uneven surface to be joined is provided on each of the two thermoplastic resin moldings.

17. The process of claim 12, 13, 14 or 15 wherein a plurality of voids is formed between the lead frame and the uneven surface on at least one of the two thermoplastic moldings.

18. The process of claim 1, wherein the cavity for holding semiconductors is provided in a center portion of at least one of the two thermoplastic resin moldings and an uneven surface to be joined to the lead frame is provided at each end of the surface to be joined of at least one of the two thermoplastic resin moldings adjacent to the cavity and the hermetic seal between the lead frame and the two thermoplastic resin moldings is formed around the cavity.

19. The process of claim 12, 13, 14, 15 or 18, wherein the lead frame is provided with a plurality of lead gaps and the lead frame is arranged between said two thermoplastic resin moldings so that a plurality of the lead gaps is arranged between the two thermoplastic resin moldings whereby molten resin flows into said lead gaps upon application of heat and pressure.

20. The process of claim 1, wherein said uneven surface is in the shape of a single continuous projection provided on one of the two thermoplastic resin moldings having no cavity to enclose the portion corresponding to the cavity in the other of the two thermoplastic resin moldings.

21. The process of claim 1, wherein said uneven surface is a projection formed by a hollow portion provided on at least a part of the surface to be joined and the cavity on one of the two thermoplastic resin moldings.

* * * * *